(12) United States Patent
Nakano et al.

(10) Patent No.: US 6,593,822 B2
(45) Date of Patent: Jul. 15, 2003

(54) OSCILLATOR FOR ACHIEVING STABLE OSCILLATION

(75) Inventors: Kazuhiro Nakano, Fukushima-ken (JP); Isao Ishigaki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/894,302

(22) Filed: Jun. 27, 2001

(65) Prior Publication Data

US 2002/0000887 A1 Jan. 3, 2002

(30) Foreign Application Priority Data

Jun. 30, 2000 (JP) ....................................... 2000-203033

(51) Int. Cl.[7] ............................................... H03B 1/00
(52) U.S. Cl. ............... 331/74; 331/117 R; 331/117 FE; 331/108 R
(58) Field of Search ................... 331/74, 2, 47, 331/108 R, 117 R, 116 FE, 117 FE, 46, 48, 40, 117 D, 175, 107 SL, 179, 167

(56) References Cited

U.S. PATENT DOCUMENTS

| 4,143,324 A | * | 3/1979 | Davis | 329/359 |
|---|---|---|---|---|
| 4,283,691 A | * | 8/1981 | Burgoon | 331/116 R |
| 4,769,621 A | * | 9/1988 | Kipnis | 331/117 R |
| 5,379,003 A | * | 1/1995 | Bizen | 331/117 R |
| 5,508,665 A | * | 4/1996 | Chan et al. | 331/101 |
| 5,805,028 A | * | 9/1998 | Kato | 331/116 R |
| 5,982,240 A | * | 11/1999 | Hayashi | 331/40 |
| 6,359,521 B1 | * | 3/2002 | Nakano et al. | 331/117 R |
| 6,411,168 B2 | * | 6/2002 | Yoshida | 331/49 |

FOREIGN PATENT DOCUMENTS

| JP | 9-246864 | 9/1997 |
| JP | 11-312924 | 11/1999 |
| JP | 2001-968932 | 3/2001 |

* cited by examiner

*Primary Examiner*—Robert Pascal
*Assistant Examiner*—Kimberly E Glenn
(74) *Attorney, Agent, or Firm*—Brinks Hofer Gilson & Lione

(57) ABSTRACT

An oscillator includes an oscillator circuit which includes an oscillator transistor and a resonant circuit. The oscillator circuit can change an oscillation frequency. An amplifier circuit receives an oscillation signal output from the oscillator circuit and amplifies the oscillation signal. The resonant circuit is connected at high frequencies between the base and the collector of the oscillator transistor. The oscillation signal is output from the resonant circuit.

6 Claims, 3 Drawing Sheets

OSCILLATOR FOR ACHIEVING STABLE OSCILLATION

BACKGROUND OF THE INVENTION

1. Field of the Invention

The present invention relates to oscillators which include oscillator circuits and amplifier circuits for amplifying oscillation signals output from the oscillator circuits.

2. Description of the Related Art

FIG. 3 shows a conventional oscillator. An oscillator circuit 50 includes an oscillator transistor 51 and a resonant circuit 52. The collector of the oscillator transistor 51 is grounded at high frequencies by a DC-blocking capacitor 53. The collector of the oscillator transistor 51 is connected to a power supply terminal 55 through a choke inductor 54. The emitter is grounded by an emitter bias resistor 56 and an inductance device 57 which is connected in series to the emitter bias resistor 56. A feedback capacitor 58 is connected between the base and the emitter, and a feedback capacitor 59 is connected between the emitter and the ground. A bias voltage is applied to the base by base bias resistors 60 and 61.

The resonant circuit 52 includes a microstrip line 52a, a varactor diode 52b, and the like. One end of the microstrip line 52a and the anode of the varactor diode 52b are grounded. The other end of the microstrip line 52a is connected to the base of the oscillator transistor 51 through a coupling capacitor 52c. The other end is also connected to the cathode of the varactor diode 52b through a DC-blocking capacitor 52d.

The cathode of the varactor diode 52b is connected to a control terminal 63 through a choke inductor 62. The control terminal 63 is grounded at high frequencies by a DC-blocking capacitor 64. Voltage for changing the capacitance of the varactor diode 52b is applied to the control terminal 63.

An amplifier circuit 70 includes an amplifier transistor 71. The collector of the amplifier transistor 71 is grounded by a capacitor 73. The collector is also connected to an output terminal 75 through a coupling capacitor 74.

A coupling capacitor 76 is connected between the emitter of the oscillator transistor 51 and the amplifier transistor 71. An oscillation signal is input to the base of the amplifier transistor 71.

The oscillation frequency is changed by changing the voltage applied to the control terminal 63.

In the above-described conventional oscillator, an oscillation signal is output from the emitter of the oscillator transistor 51. Since the voltage of the emitter can vary as much as approximately 0.3 V in accordance with a change in the ambient temperature, the level of the oscillation signal will change accordingly. Thus, a problem results in that the level of the oscillation signal input to the amplifier circuit 70 varies.

The emitter of the oscillator transistor 51 is the point at which the oscillator transistor 51 is connected to the two feedback capacitors 58 and 59. When the impedance of the amplifier circuit 70, which is a load, changes in accordance with a change in the oscillation frequency, that is, when there is load fluctuation, the substantial feedback capacitance between the base and the emitter of the oscillator transistor 51 and the substantial feedback capacitance between the emitter and the collector change. A change in the amount of feedback results in a decrease in the stability of oscillation and the level of the oscillation output. Since the level of the oscillation output obtained is divided between the two feedback capacitors 58 and 59, the level is low.

SUMMARY OF THE INVENTION

Accordingly, it is an object of the present invention to suppress variations in the level of an oscillation signal due to temperature and to obtain a large oscillation output level by performing stable oscillation without changes in the amount of feedback caused by load fluctuation.

According to the present invention, the foregoing objects are achieved through provision of an oscillator including an oscillator circuit which includes an oscillator transistor and a resonant circuit, the oscillator circuit being capable of changing an oscillation frequency; and an amplifier circuit for receiving an oscillation signal output from the oscillator circuit and amplifying the oscillation signal. The resonant circuit is connected at high frequencies between the base and the collector of the oscillator transistor. The oscillation signal is output from the resonant circuit.

The oscillation signal may be output from one end of the resonant circuit.

The collector of the oscillator transistor may be grounded at high frequencies, and the oscillation signal may be output from the base of the oscillator transistor.

The collector of the oscillator transistor may be grounded at high frequencies. The resonant circuit may include a resonant line. One end of the resonant line may be grounded, and the other end of the resonant line may be connected to the base of the oscillator transistor. The oscillation signal may be output from a position at the middle of the resonant line in the longitudinal direction.

The amplifier circuit may include an amplifier transistor. The emitter of the amplifier transistor may be connected to the collector of the oscillator transistor, and a common bias current may be directed to flow through the amplifier transistor and the oscillator transistor. The oscillation signal may be input to the base of the amplifier transistor.

According to the present invention, it is possible to minimize variations in the level of an oscillation signal caused by temperature change. Even when load fluctuation is caused by changing an oscillation frequency, the substantial feedback amount between the base and the emitter of an oscillator transistor does not change, nor does the substantial feedback amount between the emitter and the collector change. Thus, stable oscillation can be achieved. The level of an output oscillation signal is increased. A grounded-collector oscillator transistor can achieve stable oscillation. Since impedances of an amplifier circuit can be matched easily, it is possible to efficiently input oscillation power to an amplifier transistor. With a grounded-collector oscillator circuit and a grounded-emitter amplifier circuit, the current consumption is reduced and the gain is increased.

DESCRIPTION OF THE PREFERRED EMBODIMENTS

Figure 1:
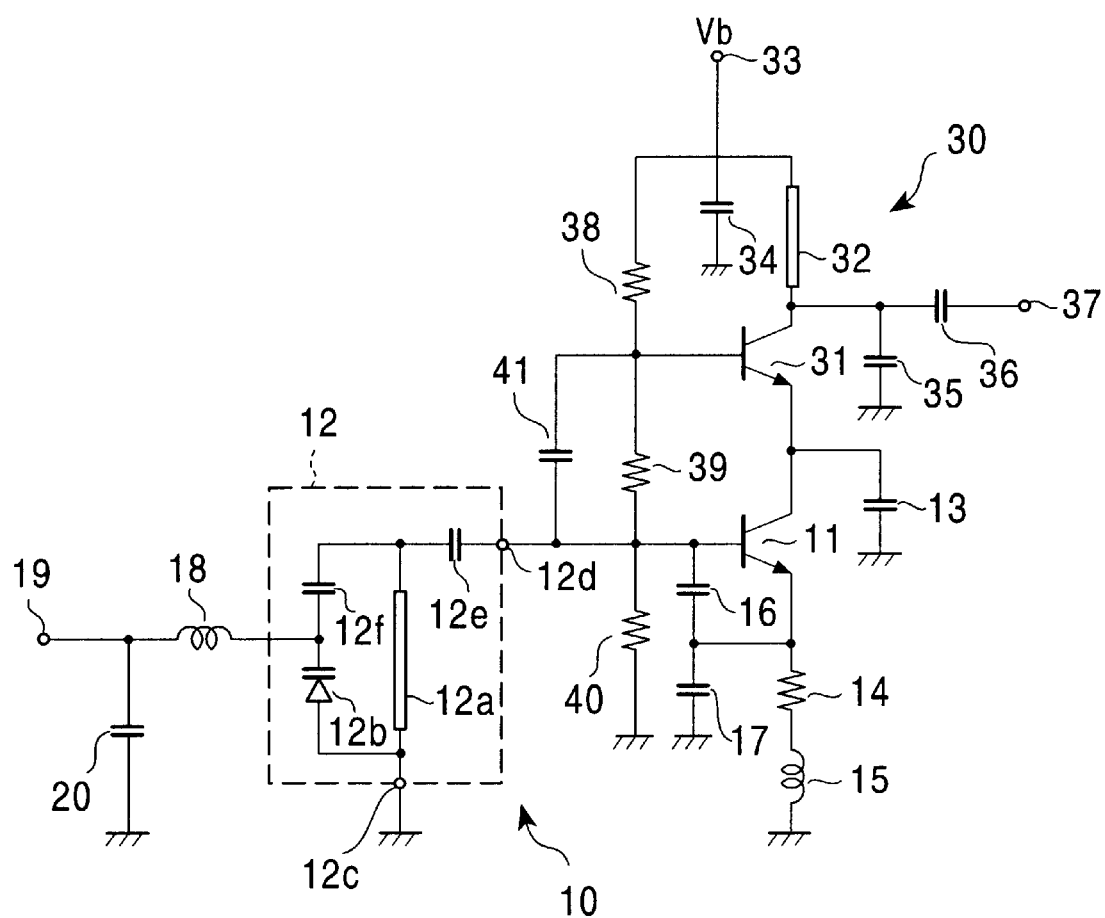
FIG. 1 is a circuit diagram of the structure of an oscillator according to a first embodiment of the present invention.

FIG. 1 shows an oscillator according to a first embodiment of the present invention. An oscillator circuit 10 includes an oscillator transistor 11 and a resonant circuit 12. The collector of the oscillator transistor 11 is grounded at high frequencies by a DC-blocking capacitor 13. The emitter of the oscillator transistor 11 is grounded by an emitter bias resistor 14 and an inductance device 15 which is connected in series to the emitter bias resistor 14. A feedback capacitor 16 is connected between the base and the emitter, and a feedback capacitor 17 is connected between the emitter and the ground.

The resonant circuit 12 is a two-terminal circuit which includes a resonant line 12a which is formed of a microstrip line, a varactor diode 12b, and the like. One end 12c (one end of the resonant line 12a and the cathode of the varactor diode 12b) of the resonant circuit 12 is grounded, and the other end 12d is connected to the base of the oscillator transistor 11. Thus, the resonant circuit 12 is connected at high frequencies between the base and the collector of the oscillator transistor 11. The other end of the resonant line 12a is connected to the other end 12d of the resonant circuit 12 through a coupling capacitor 12e. Also, the other end of the resonant line 12a is connected to the cathode of the varactor diode 12b through a DC-blocking capacitor 12f.

The cathode of the varactor diode 12b is connected to a control terminal 19 through a choke inductor 18. The control terminal 19 is grounded at high frequencies by a DC-blocking capacitor 20. Voltage for changing the capacitance of the varactor diode 12b is applied to the control terminal 19.

An amplifier circuit 30 includes an amplifier transistor 31. The emitter of the amplifier transistor 31 is connected to the collector of the oscillator transistor 11. The collector of the amplifier transistor 31 is connected to a power supply terminal 33 through a choke inductor 32 which is formed of a microstrip line. A voltage Vb is applied to the power supply terminal 33. The power supply terminal 33 is grounded at high frequencies by a DC-blocking capacitor 34. The collector of the amplifier transistor 31 is grounded by a capacitor 35. Also, the collector is connected to an output terminal 37 through a coupling capacitor 36.

A bias voltage is applied to each base of the oscillator transistor 11 and the amplifier transistor 31 by base bias resistors 38, 39, and 40 which are connected in series between the power supply terminal 33 and the ground. As a result, a common bias current flows through the oscillator transistor 11 and the amplifier transistor 31.

An injection coupling capacitor 41 is connected between the other end 12d of the resonant circuit 12 and the amplifier transistor 31. An oscillation signal is input to the base of the amplifier transistor 31.

The oscillation frequency changes in accordance with the voltage applied to the control terminal 19. When oscillation is performed, an oscillation signal reaches its maximum at the other end 12d of the resonant circuit 12.

In the first embodiment, the oscillation signal is output from the resonant circuit 12. When the voltage of the emitter of the oscillator transistor 31 changes in accordance with temperature change, the influence on the oscillation signal is small and the change in the oscillation signal level is small.

When load fluctuation in the amplifier circuit 30 occurs due to a change in the oscillation frequency, the substantial feedback amount between the base and the emitter of the oscillator transistor 31 does not change, nor does the substantial feedback amount between the emitter and the collector change.

Since the oscillation signal is output from the other end 12d (in this case, namely, the base of the oscillator transistor 11) of the resonant circuit 12, the level reaches its maximum.

The amplified oscillation signal is output from the collector of the amplifier transistor 31 to the output terminal 37.

Figure 2:
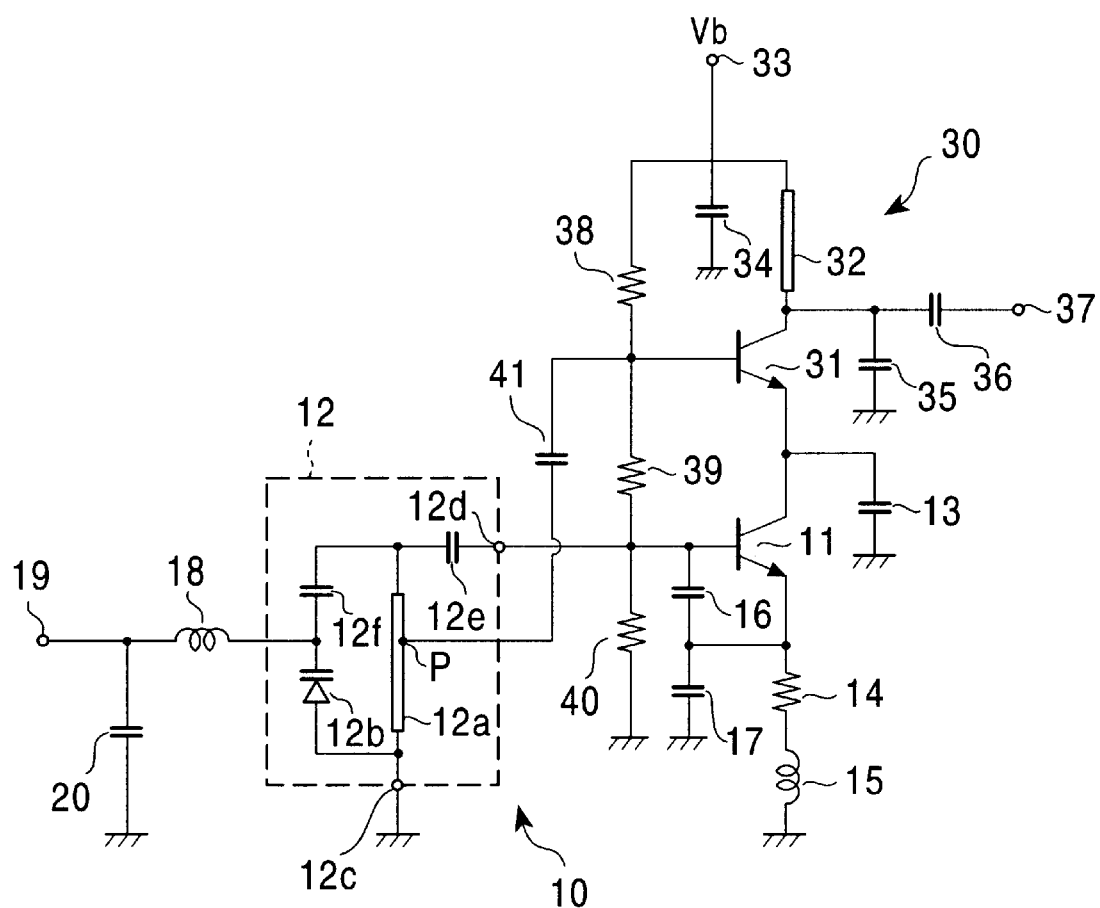
FIG. 2 is a circuit diagram of the structure of an oscillator according to a second embodiment of the present invention.
Figure 3:
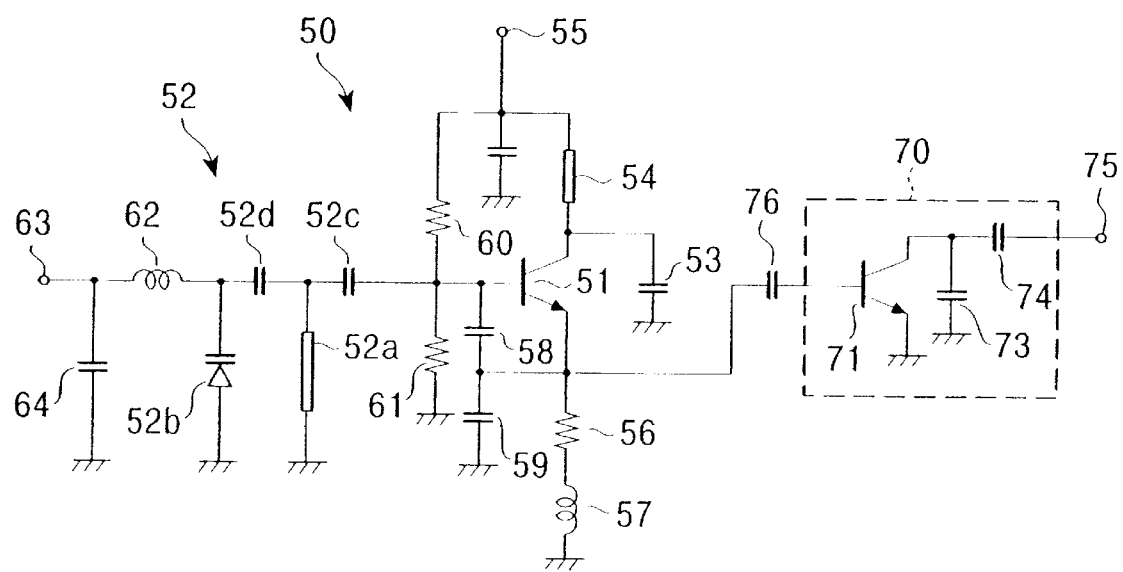
FIG. 3 is a circuit diagram of the structure of a conventional oscillator.

FIG. 2 shows an oscillator according to a second embodiment of the present invention. In the oscillator shown in FIG. 2, the position at which the oscillation signal is output is different from that of the oscillator shown in FIG. 1. The remaining structure of the oscillator shown in FIG. 2 is the same as that shown in FIG. 1.

Specifically, position P at an intermediate point of the resonant line 12a in the longitudinal direction, preferably the middle, is connected to the base of the amplifier transistor 31 through the coupling capacitor 41. Thus, the oscillation signal is output from within the resonant circuit 12. When there is load fluctuation in the amplifier transistor 31, the influence on a change in the amount of feedback is further reduced.

In this case, the impedance at the position p is smaller than the impedance at the other end 12d, and the input impedance at the base, which is the input end of the amplifier transistor 31, is small. By matching the impedances, it is possible to input large oscillation power to the amplifier transistor 31.

According to the present invention, the emitter of the amplifier transistor 31 is connected to the collector of the oscillator transistor 11, and the collector of the oscillator transistor 11 is grounded at high frequencies. Thus, the emitter of the amplifier transistor 21 is grounded. It is therefore possible to achieve a large gain by inputting the oscillation signal to the base of the amplifier transistor 31 and to reduce the current consumption.

What is claimed is:

1. An oscillator comprising:
   an oscillator circuit including an oscillator transistor and a resonant circuit, said oscillator circuit having a changeable oscillation frequency; and
   an amplifier circuit to receive an oscillation signal output from said oscillator circuit and amplify the oscillation signal,
   wherein the resonant circuit is connected at high frequencies between a base and a collector of the oscillator transistor,
   the oscillation signal is output from the resonant circuit,
   the collector of the oscillator transistor is grounded at high frequencies, and
   the oscillation signal is output from the base of the oscillator transistor.

2. An oscillator according to claim 1, wherein said amplifier circuit includes an amplifier transistor;
   an emitter of the amplifier transistor is connected to the collector of the oscillator transistor, and a common bias current is directed to flow through the amplifier transistor and the oscillator transistor; and
   the oscillation signal is input to a base of the amplifier transistor.

3. An oscillator comprising:
   an oscillator circuit including an oscillator transistor and a resonant circuit, said oscillator circuit having a changeable oscillation frequency; and
   an amplifier circuit to receive an oscillation signal output from said oscillator circuit and amplify the oscillation signal;
   wherein the resonant circuit is connected at high frequencies between a base and a collector of the oscillator transistor,
   the oscillation signal is output from one end of the resonant circuit, the collector of the oscillator transistor is grounded at high frequencies, and the oscillation signal is output from the base of the oscillator transistor.

4. An oscillator according to claim 3, wherein said amplifier circuit includes an amplifier transistor;

an emitter of the amplifier transistor is connected to the collector of the oscillator transistor, and a common bias current is directed to flow through the amplifier transistor and the oscillator transistor; and the oscillation signal is input to a base of the amplifier transistor.

5. An oscillator comprising:

an oscillator circuit including an oscillator transistor and a resonant circuit, said oscillator circuit having a changeable oscillation frequency; and an amplifier circuit to receive an oscillation signal output from said oscillator circuit and amplify the oscillation signal, wherein the resonant circuit is connected at high frequencies between a base and a collector of the oscillator transistor, the oscillation signal is output from the resonant circuit, the collector of the oscillator transistor is grounded at high frequencies, the resonant circuit includes a resonant line, one end of the resonant line is grounded, the other end of the resonant line is connected to the base of the oscillator transistor, and the oscillation signal is output from an intermediate position of the resonant line in a longitudinal direction.

6. An oscillator according to claim 5, wherein said amplifier circuit includes an amplifier transistor;

an emitter of the amplifier transistor is connected to the collector of the oscillator transistor, and a common bias current is directed to flow through the amplifier transistor and the oscillator transistor; and the oscillation signal is input to a base of the amplifier transistor.

* * * * *

UNITED STATES PATENT AND TRADEMARK OFFICE
CERTIFICATE OF CORRECTION

PATENT NO. : 6,593,822 B2
DATED : July 15, 2003
INVENTOR(S) : Kazuhiro Nakano et al.

It is certified that error appears in the above-identified patent and that said Letters Patent is hereby corrected as shown below:

<u>Title page,</u>
Item [56], References Cited, FOREIGN PATENT DOCUMENTS, delete "2001-968932" and substitute -- 2001-68932 -- in its place.

Signed and Sealed this

Fourth Day of November, 2003

JAMES E. ROGAN
*Director of the United States Patent and Trademark Office*